United States Patent
Tsai et al.

(10) Patent No.: US 9,774,073 B2
(45) Date of Patent: Sep. 26, 2017

(54) MOBILE DEVICE AND MULTI-BAND ANTENNA STRUCTURE THEREIN

(71) Applicant: HTC Corporation, Taoyuan, Taoyuan County (TW)

(72) Inventors: Tiao-Hsing Tsai, Taoyuan (TW); Chien-Pin Chiu, Taoyuan (TW); Hsiao-Wei Wu, Taoyuan (TW); Ying-Chih Wang, Taoyuan (TW)

(73) Assignee: HTC CORPORATION, Taoyuan (TW)

( * ) Notice: Subject to any disclaimer, the term of this patent is extended or adjusted under 35 U.S.C. 154(b) by 228 days.

(21) Appl. No.: 14/157,126

(22) Filed: Jan. 16, 2014

(65) Prior Publication Data

US 2015/0200448 A1 Jul. 16, 2015

(51) Int. Cl.
*H01Q 1/24* (2006.01)
*H01Q 9/42* (2006.01)
*H01Q 13/10* (2006.01)
*H01Q 5/371* (2015.01)
*H05K 1/16* (2006.01)

(52) U.S. Cl.
CPC ............. *H01Q 1/243* (2013.01); *H01Q 5/371* (2015.01); *H01Q 9/42* (2013.01); *H01Q 13/10* (2013.01); *H05K 1/165* (2013.01); *H05K 2201/10098* (2013.01); *Y10T 29/49018* (2015.01)

(58) Field of Classification Search
CPC ........ H01Q 13/106; H01Q 5/30; H01Q 5/307; H01Q 5/342; H01Q 5/35; H01Q 5/378; H01Q 1/2258–1/243; H01Q 5/50; H01Q 9/30; H01Q 9/42; H01Q 13/10; H01Q 21/29; H01Q 21/30; H01Q 1/44; H01Q 19/22; H01Q 19/26

USPC ................................... 343/700 MS, 702, 767
See application file for complete search history.

(56) References Cited

U.S. PATENT DOCUMENTS

| | | | |
|---|---|---|---|
| 7,026,999 B2 * | 4/2006 | Umehara | H01Q 1/243 343/700 MS |
| 7,375,686 B2 | 5/2008 | Ku et al. | |
| 7,570,218 B2 * | 8/2009 | Tsujimura | G06F 1/1616 343/700 MS |

(Continued)

FOREIGN PATENT DOCUMENTS

| | | |
|---|---|---|
| CN | 1507113 A | 6/2004 |
| CN | 1901278 A | 1/2007 |

(Continued)

*Primary Examiner* — Tho G Phan
*Assistant Examiner* — Patrick Holecek
(74) *Attorney, Agent, or Firm* — Birch, Stewart, Kolasch & Birch, LLP

(57) ABSTRACT

A mobile device includes a ground plane, a grounding branch, a connection element, a first radiation branch, and a second radiation branch. The grounding branch is coupled to the ground plane. A first open slot is formed and substantially surrounded by the grounding branch and the ground plane. The first radiation branch is coupled through the connection element to the grounding branch. A second open slot is formed and is substantially surrounded by the first radiation branch and the grounding branch. The second radiation branch is disposed in the second open slot and is coupled to the grounding branch. A multi-band antenna structure is formed by the grounding branch, the connection element, the first radiation branch, and the second radiation branch.

22 Claims, 10 Drawing Sheets

(56) References Cited

U.S. PATENT DOCUMENTS

| | | | |
|---|---|---|---|
| 8,125,392 B2* | 2/2012 | Furuya | H01Q 1/38 343/700 MS |
| 8,260,385 B2* | 9/2012 | Kim | H01Q 1/2266 343/702 |
| 8,264,412 B2* | 9/2012 | Ayala | H01Q 1/2266 343/700 MS |
| 8,395,555 B2* | 3/2013 | Hobson | H01Q 1/243 343/702 |
| 8,514,132 B2* | 8/2013 | Rao | H01Q 1/243 343/700 MS |
| 8,599,084 B2* | 12/2013 | Wong | H01Q 1/243 343/749 |
| 8,994,606 B2* | 3/2015 | Yamamoto | H01Q 1/273 343/718 |
| 9,160,058 B2* | 10/2015 | Tsou | H01Q 1/2266 |
| 9,172,139 B2* | 10/2015 | Pascolini | H01Q 7/00 |
| 2002/0180650 A1 | 12/2002 | Pankinaho et al. | |
| 2004/0137950 A1* | 7/2004 | Bolin | H01Q 1/243 455/562.1 |
| 2007/0035446 A1 | 2/2007 | Pan et al. | |
| 2007/0241971 A1 | 10/2007 | Tsujimura et al. | |
| 2008/0316121 A1 | 12/2008 | Hobson et al. | |
| 2010/0265157 A1 | 10/2010 | Yang et al. | |
| 2011/0133995 A1 | 6/2011 | Pascolini et al. | |
| 2011/0254741 A1* | 10/2011 | Ishimiya | H01Q 1/243 343/702 |
| 2012/0169555 A1 | 7/2012 | Tsou | |
| 2013/0088404 A1 | 4/2013 | Ramachandran et al. | |
| 2013/0154886 A1* | 6/2013 | Isohatala | H01Q 1/243 343/702 |
| 2013/0225234 A1 | 8/2013 | Cheng et al. | |
| 2014/0078008 A1* | 3/2014 | Kang | H01Q 5/35 343/702 |
| 2014/0210675 A1* | 7/2014 | Hwang | H01Q 1/44 343/702 |
| 2015/0123871 A1* | 5/2015 | Chang | H01Q 1/243 343/872 |

FOREIGN PATENT DOCUMENTS

| | | |
|---|---|---|
| CN | 200986965 Y | 12/2007 |
| TW | 200633301 A | 9/2006 |
| TW | M395918 U1 | 1/2011 |
| WO | WO 2005/043674 A1 | 5/2005 |

* cited by examiner

MOBILE DEVICE AND MULTI-BAND ANTENNA STRUCTURE THEREIN

BACKGROUND OF THE INVENTION

Field of the Invention

The subject application generally relates to a mobile device, and more specifically, to a mobile device including a multi-band antenna structure.

Description of the Related Art

With the advancement of mobile communication technology, mobile devices such as portable computers, mobile phones, multimedia players, and other hybrid functional portable electronic devices have become more common. To satisfy the demand of users, mobile devices usually can perform wireless communication functions. Some devices cover a large wireless communication area; these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, and 2500 MHz. Some devices cover a small wireless communication area; these include mobile phones using Wi-Fi, Bluetooth, and WiMAX (Worldwide Interoperability for Microwave Access) systems and using frequency bands of 2.4 GHz, 3.5 GHz, 5.2 GHz, and 5.8 GHz.

Antennas are indispensable elements of mobile devices for wireless communication. Since current designs have made today's mobile devices lighter and thinner, it is a critical challenge for antenna designers to appropriately design a multi-band antenna in the limited inner space of a mobile device.

BRIEF SUMMARY OF THE INVENTION

In one exemplary embodiment, the subject application is directed to a mobile device including a ground plane, a grounding branch, a connection element, a first radiation branch, and a second radiation branch. The grounding branch is coupled to the ground plane. A first open slot is formed and is substantially surrounded by the grounding branch and the ground plane. The first radiation branch is electrically coupled through the connection element to the grounding branch. A second open slot is formed and is substantially surrounded by the first radiation branch and the grounding branch. The second radiation branch is disposed in the second open slot and is coupled to the grounding branch. A multi-band antenna structure is formed by the grounding branch, the connection element, the first radiation branch, and the second radiation branch.

In another exemplary embodiment, the subject application is directed to a method for manufacturing a mobile device, including the steps of: providing a ground plane; coupling a grounding branch to the ground plane, wherein a first open slot is formed and is substantially surrounded by the grounding branch and the ground plane; coupling a first radiation branch through a connection element to the grounding branch, wherein a second open slot is formed and is substantially surrounded by the first radiation branch and the grounding branch; disposing a second radiation branch in the second open slot, and coupling the second radiation branch to the grounding branch; and integrating the grounding branch, the connection element, the first radiation branch, and the second radiation branch to form a multi-band antenna structure.

BRIEF DESCRIPTION OF DRAWINGS

The subject application can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Figure 1:
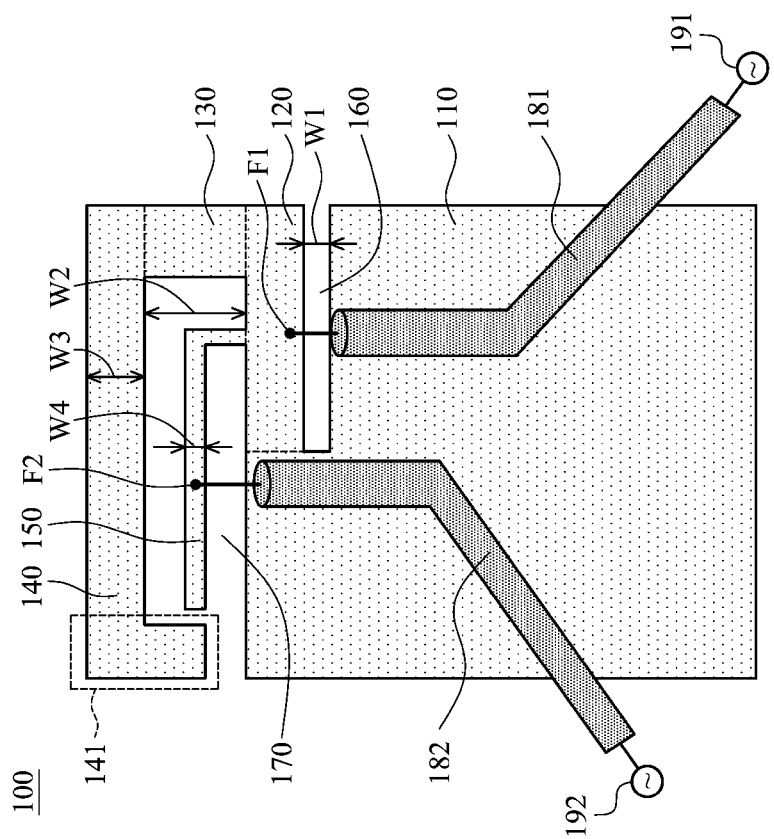
FIG. 1 shows a diagram of a mobile device according to an embodiment of the invention.

FIG. 1 shows a diagram of a mobile device 100 according to an embodiment of the invention. More specifically, the diagram is a plan developed view of an antenna structure of the mobile device 100. For example, the mobile device 100 may be a smartphone, a tablet computer, or a notebook computer. As shown in FIG. 1, the mobile device 100 at least includes a ground plane 110, a grounding branch 120, a connection element 130, a first radiation branch 140, and a second radiation branch 150. The above components of the mobile device 100 may be made of conductive materials, such as silver, copper, aluminum, iron, or alloys thereof. The above components or partial components of the mobile device 100 may be disposed on a dielectric substrate, such as an FR4 (Flame Retardant 4) substrate, a system circuit board, or a flexible and hard composite board. The grounding branch 120 is coupled to the ground plane 110. A first open slot 160 is formed and is substantially surrounded by the grounding branch 120 and the ground plane 110. The first radiation branch 140 is electrically coupled through the connection element 130 to the grounding branch 120. A second open slot 170 is formed and is substantially surrounded by the first radiation branch 140 and the grounding branch 120. The second radiation branch 150 is disposed in the second open slot 170, and is coupled to the grounding branch 120. In a preferred embodiment, a multi-band antenna structure is formed by the grounding branch 120, the connection element 130, the first radiation branch 140, and the second radiation branch 150. The mobile device 100 may further include other essential components, such as a touch input module, a display module, a processor module, a control module, and a power supply module (not shown). Note that although FIG. 1 displays a planned multi-band antenna structure, adjustments may be made in other embodiments such that it is replaced with a three-dimensional multi-band antenna structure. Inner components of the three-dimensional multi-band antenna structure may be respectively disposed or formed on different carriers, such as a PCB (Planar Circuit Board), an FPCB (Flexible Printed Circuit Board), and a housing (not shown).

The aforementioned multi-band antenna structure has a first feeding point F1 and a second feeding point F2. In some embodiments, the first feeding point F1 is positioned at the grounding branch 120 (e.g., substantially at the middle of the grounding branch 120), and the second feeding point F2 is positioned at the second radiation branch 150 (e.g., substantially at the middle of the second radiation branch 150). The first feeding point F1 may be coupled through a first coaxial cable 181 to a first signal source 191, and the second feeding point F2 may be coupled through a second coaxial cable 182 to a second signal source 192. The first signal source 191 and the second signal source 192 may be two different RF (Radio Frequency) modules for generating respective feeding signals at different frequencies so as to excite the aforementioned multi-band antenna structure.

In some embodiments, the first open slot 160 and the second open slot 170 each have a straight-line shape. The first open slot 160 may be substantially parallel to the second open slot 170. The open end of the first open slot 160 and the open end of the second open slot 170 may be substantially toward opposite directions. The width W2 of the second open slot 170 may be much greater than the width W1 of the first open slot 160. In some embodiments, a combination of the grounding branch 120, the connection element 130, and the first radiation branch 140 substantially has an inverted U-shape. In some embodiments, the first radiation branch 140 further has a bending end 141 extending toward the open end of the second open slot 170, such that the second open slot 170 has a non-equal width. In other embodiments, adjustments are made such that the first radiation branch 140 does not have any bending end and substantially has a straight-line shape, and the second open slot 170 has an equal width (not shown). In some embodiments, the second radiation branch 150 substantially has an inverted L-shape. The width W4 of the second radiation branch 150 may be much smaller than the width W3 of the first radiation branch 140.

Figure 2A:
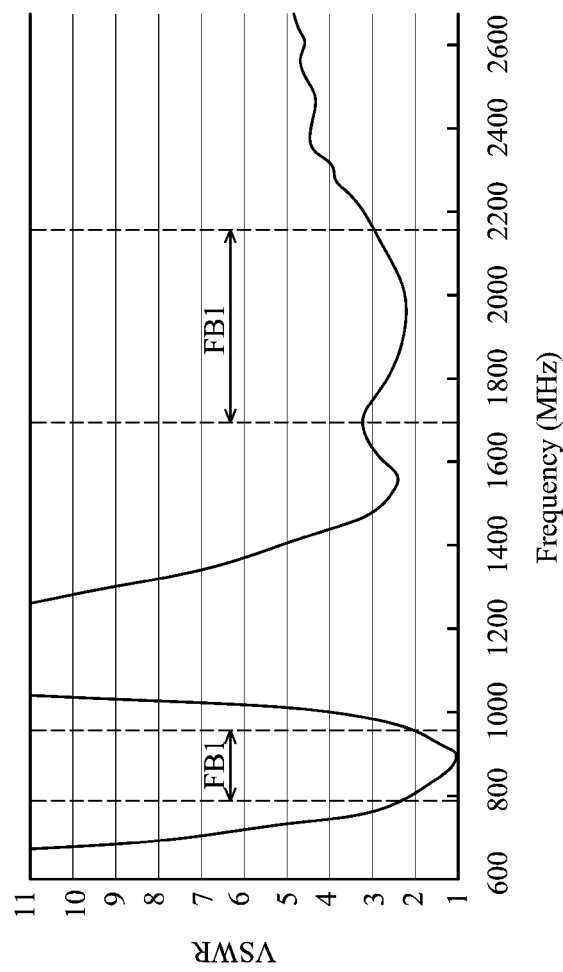
FIG. 2A shows a diagram of a VSWR (Voltage Standing Wave Ratio) of a multi-band antenna structure of a mobile device when the multi-band antenna structure is fed from a first feeding point, according to an embodiment of the invention.

FIG. 2A shows a diagram of a VSWR (Voltage Standing Wave Ratio) of the multi-band antenna structure of the mobile device 100 when the multi-band antenna structure is fed from the first feeding point F1, according to an embodiment of the invention. The horizontal axis represents operation frequency (MHz), and the vertical axis represents the VSWR. According to the measurement result of FIG. 2A, when the multi-band antenna structure is fed by the first signal source 191, the multi-band antenna structure covers a mobile communication band FB1. In some embodiments, a low-frequency portion of the mobile communication band FB1 is from about 791 MHz to about 960 MHz, and a high-frequency portion of the mobile communication band FB1 is from about 1710 MHz to about 2170 MHz.

Figure 2B:
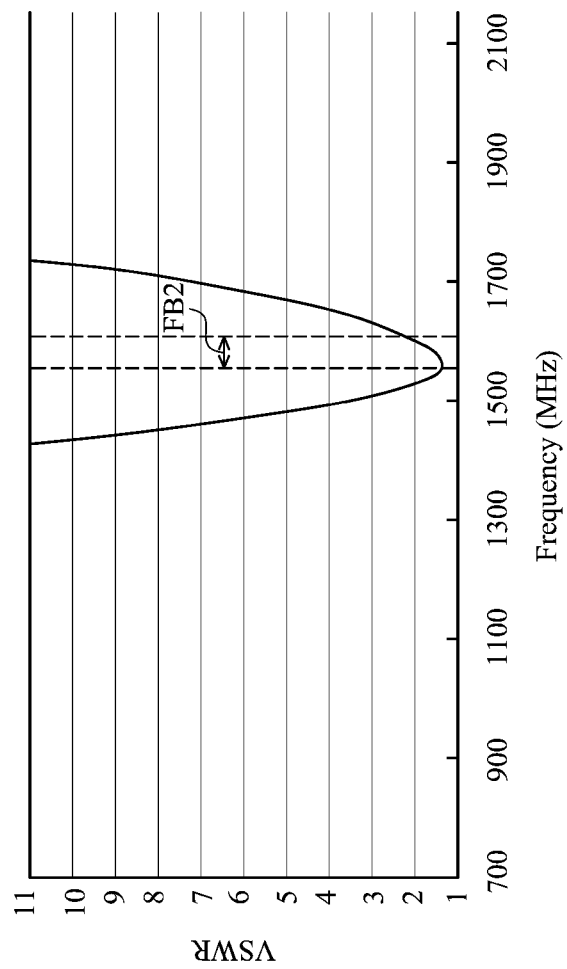
FIG. 2B shows a diagram of a VSWR of a multi-band antenna structure of a mobile device when the multi-band antenna structure is fed from a second feeding point, according to an embodiment of the invention.

FIG. 2B shows a diagram of a VSWR of the multi-band antenna structure of the mobile device 100 when the multi-band antenna structure is fed from the second feeding point F2, according to an embodiment of the invention. The horizontal axis represents operation frequency (MHz), and the vertical axis represents the VSWR. According to the measurement result of FIG. 2B, when the multi-band antenna structure is fed by the second signal source 192, the multi-band antenna structure covers a positioning system band FB2. For example, the aforementioned positioning system may be a GPS (Global Positioning System), a GNSS (Global Navigation Satellite System), a BDS (BeiDou Navigation Satellite System), or a Galileo positioning system. The following embodiments will use the GPS as an example for illustration. In some embodiments, the positioning system band FB2 is from about 1560 MHz to about 1615 MHz. As a result, the multi-band antenna structure of the invention at least supports the multi-band operations of LTE Band 20/GSM850/GSM900/GPS/DCS1800/PCS1900/UMTS.

Figure 3:
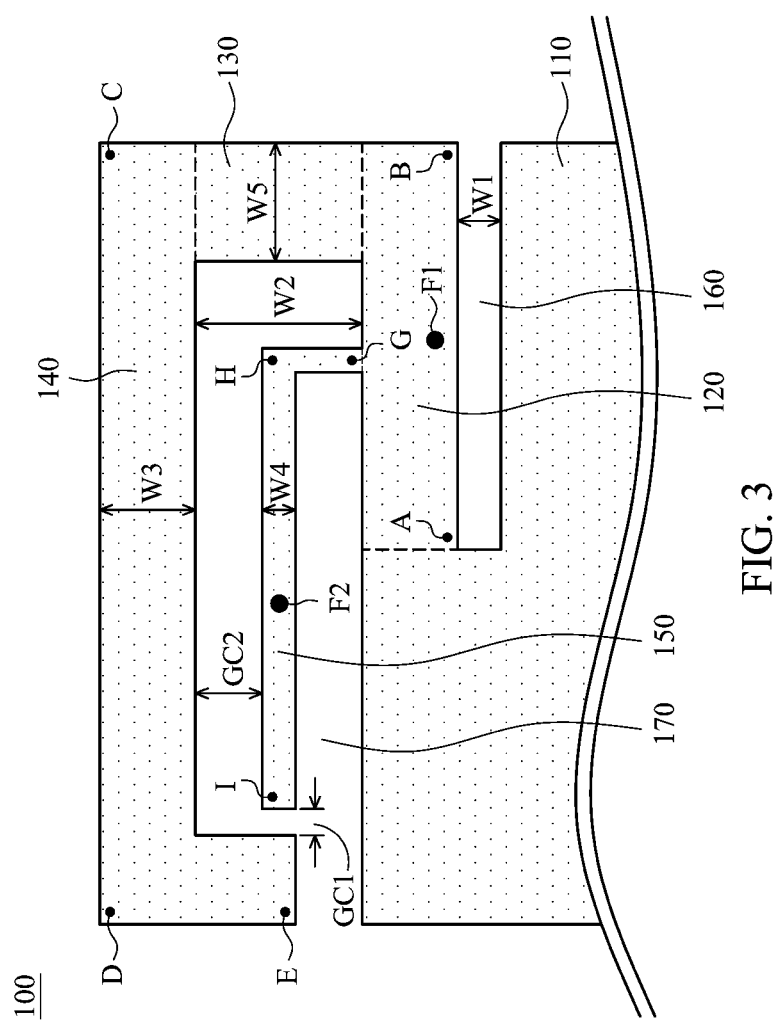
FIG. 3 shows a planar unfolded view of a multi-band antenna structure of a mobile device according to an embodiment of the invention.

FIG. 3 shows a plan developed view of the multi-band antenna structure of the mobile device 100 according to an embodiment of the invention. The plan developed view is used to illustrate the antenna operating theory of the mobile device 100. Please refer to FIGS. 2A, 2B, and 3 together. When the multi-band antenna structure is fed from the first feeding point F1, a first resonant path from point A through points B, C, and D to point E is excited to generate the low-frequency portion of the mobile communication band FB1, and a second resonant path from the first feeding point F1 to point B is excited to generate the high-frequency portion of the mobile communication band FB1 (point A may be a grounding point). An antenna designer can fine-tune the mobile communication band FB1 as follows. The resonant frequency of the mobile communication band FB1 may be adjusted by changing the length of the first resonant path and the length of the second resonant path. The bandwidth and efficiency of the mobile communication band FB1 may be adjusted by changing the width W1 of the first open slot 160. The resonant frequency of the mobile communication band FB1 may shift to a lower frequency by increasing the width W3 of the first radiation branch 140. The low-frequency portion of the mobile communication band FB1 may be adjusted by changing the width W5 of the connection element 130. On the other hand, when the multi-band antenna structure is fed from the second feeding point F2, a third resonant path from point G through point H to point I is excited to generate the GPS band FB2. An antenna designer can fine-tune the GPS band FB2 as follows. The resonant frequency of the GPS band FB2 may be adjusted by changing the length of the third resonant path. The resonant frequency of the GPS band FB2 may be adjusted by changing the position of the connection point (i.e., point G which is a grounding point) of the second radiation branch 150. Furthermore, the spacing GC1 and the spacing GC2 between the second radiation branch 150 and the first radiation branch 140 should be both longer than 0.5 mm. With such a design, the mutual coupling effect between the second radiation branch 150 and the first radiation branch 140 is reduced, such that good antenna efficiency of the multi-band antenna structure is maintained.

In some embodiments, the multi-band antenna structure has a total length of about 67 mm, a total width of about 11 mm, and a total height of about 9 mm. According to some measurements, the antenna efficiency of the multi-band antenna structure operating in the mobile communication band FB1 is greater than 49.6%, and the antenna efficiency of the multi-band antenna structure operating in the GPS band FB2 is greater than 37.1%. This can meet the requirements of practical applications. The invention incorporates two feeding elements and two radiation elements into a single antenna structure so as to support dual-wideband operations, and therefore the antenna structure has a small-size and multi-functional characteristics. In comparison to conventional designs, the invention at least has the advantages of: (1) saving inner design space of a mobile device, (2) eliminating the use of filter components, (3) suppressing component loss, and (4) reducing manufacturing cost and reducing system complexity. Therefore, the invention is suitable for application in a variety of small-size mobile communication devices.

Figure 4:
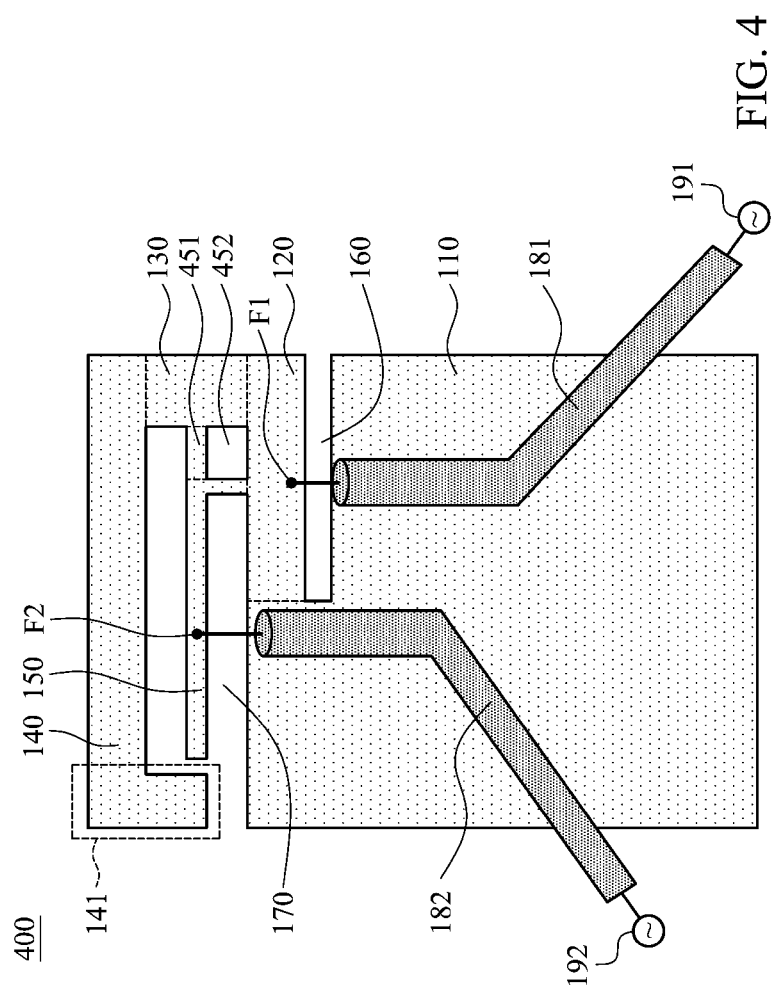
FIG. 4 shows a diagram of a mobile device according to an embodiment of the invention.

FIG. 4 shows a diagram of a mobile device 400 according to an embodiment of the invention. FIG. 4 is basically similar to FIG. 1, and the diagram is also a plan developed view of an antenna structure of the mobile device 400. The difference between the two embodiments is that the mobile device 400 of FIG. 4 further includes a shorting element 451. The shorting element 451 may be made of a conductive material, such as silver, copper, aluminum, iron, or alloys thereof. In the mobile device 400 of FIG. 4, the second radiation branch 150 is further electrically coupled through the shorting element 451 to the connection element 130, and a closed opening 452 is therefore formed between the second radiation branch 150, the shorting element 451, the connection element 130, and the grounding branch 120. The closed opening 452 may substantially have a rectangular shape or a circular shape. The closed opening 452 may be arranged to accommodate some appearance components or electronic components. In other embodiments, adjustments are made such that the closed opening 452 is filled with a conductive material. Other features of the mobile device 400 of FIG. 4 are similar to those of the mobile device 100 of FIG. 1. Therefore, the two embodiments can achieve similar levels of performance.

Figure 5A:
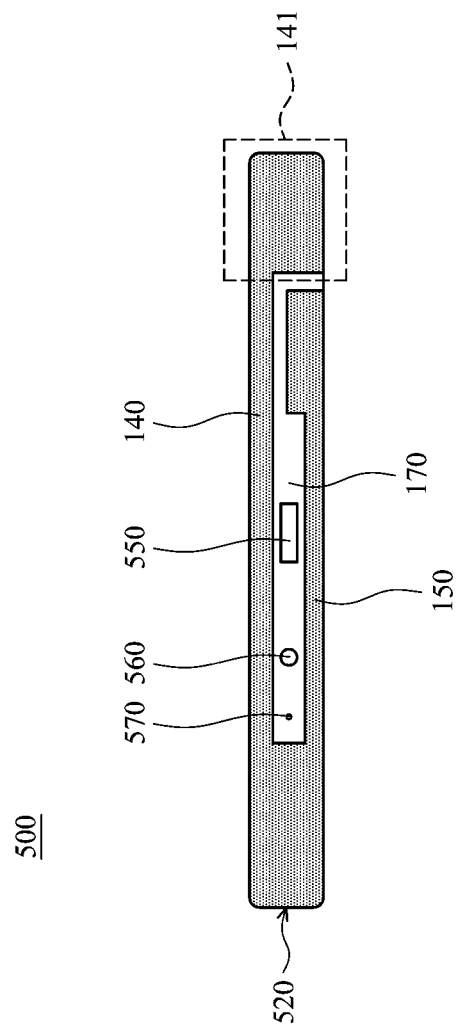
FIG. 5A shows a top view of a mobile device according to an embodiment of the invention.
Figure 5B:
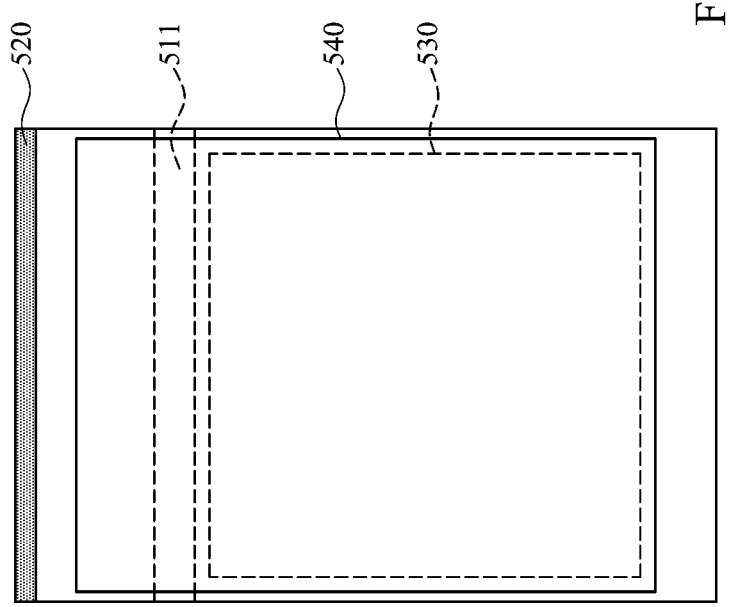
FIG. 5B shows a front view of a mobile device according to an embodiment of the invention.
Figure 5C:
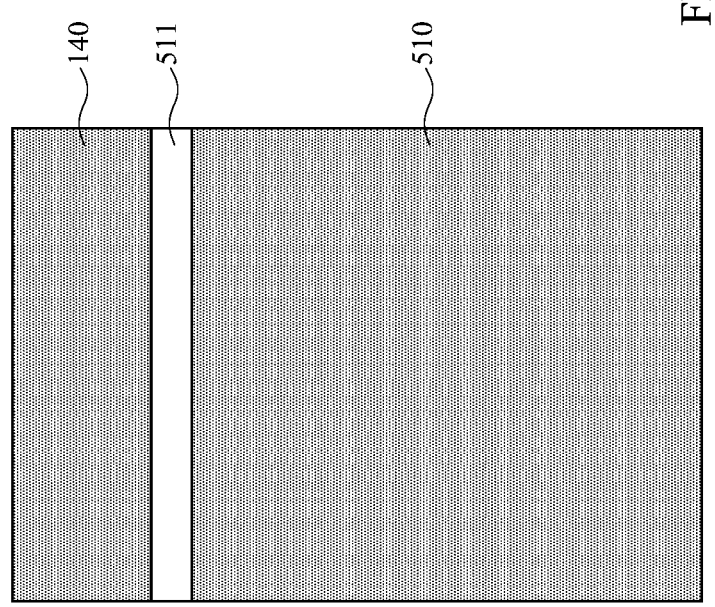
FIG. 5C shows a back view of a mobile device according to an embodiment of the invention.

FIG. 5A shows a top view of a mobile device 500 according to an embodiment of the invention. FIG. 5B shows a front view of the mobile device 500 according to an embodiment of the invention. FIG. 5C shows a back view of the mobile device 500 according to an embodiment of the invention. Please refer to FIGS. 5A, 5B, and 5C together. FIGS. 5A, 5B, and 5C are basically similar to FIG. 1. The difference between the two embodiments is that FIGS. 5A, 5B, and 5C are used to describe a three-dimensional antenna structure of FIG. 1. The mobile device 500 further includes a housing 510, an appearance metal element 520, a display module 530, and a touch control module 540. The housing 510 may include a back cover and a frame of the mobile device 500, and may be made of a conductive material or a nonconductive material. The ground plane 110, the grounding branch 120, and the connection element 130 of the mobile device 500 (not shown) are disposed inside the housing 510. The housing 510 further has a long and narrow slit 511 which is substantially aligned with the first open slot 160 between the grounding branch 120 and the ground plane 110. The long and narrow slit 511 of the housing 510 may be filled with a nonconductive material, such as a plastic material. The appearance metal element 520 is disposed on an outer surface of the housing 510 (e.g., the top surface of the housing 510). The first radiation branch 140 and the second radiation branch 150 of the mobile device 500 are both a portion of the appearance metal element 520. The connection element 130 may be a metal spring or a pogo pin, and it may be configured to electrically couple the grounding branch 120 on a dielectric substrate (not shown) to the first radiation branch 140 and the second radiation branch 150 on the housing 510. In some embodiments, the first radiation branch 140 extends from the top of the mobile device 500 to the back of the mobile device 500, and the first radiation branch 140 is disposed on the housing 510. In alternative embodiments, if the housing 510 is made of a conductive material, the first radiation branch 140 is integrated with the housing 510, or forms a portion of the housing 510. Furthermore, the second radiation branch 150 may also be integrated with the housing 510 made of a conductive material, or form another portion of the housing 510. In other words, the housing 510 may be combined with the appearance metal element 520 as a single element. Preferably, the second radiation branch 150 is disposed on the top of the mobile device 500 and is arranged in a skyward direction, such that a multi-band antenna structure of the mobile device 500 can receive and transmit signals of the GPS band FB2 easily. In addition, since the appearance metal element 520 is integrated in the multi-band antenna structure, the appearance metal element 520 does not tend to negatively affect the radiation performance of the multi-band antenna structure. Other features of the mobile device 500 of FIGS. 5A, 5B, and 5C are similar to those of the mobile device 100 of FIG. 1. Therefore, the two embodiments can achieve similar levels of performance. Note that, as shown in FIG. 5A, the region in which the appearance metal element 520 is formed still includes some non-metal areas. These non-metal areas may accommodate other electronic components, such as a power button 550, an audio jack 560, a microphone 570, a socket, or a mechanical connection component, etc. (not shown), and they may be designed and adjusted according to different requirements. In alternative embodiments, the multi-band antenna structure may be disposed on the bottom of the mobile device 500, and its detailed component configuration and design will not be described again.

Figure 6:
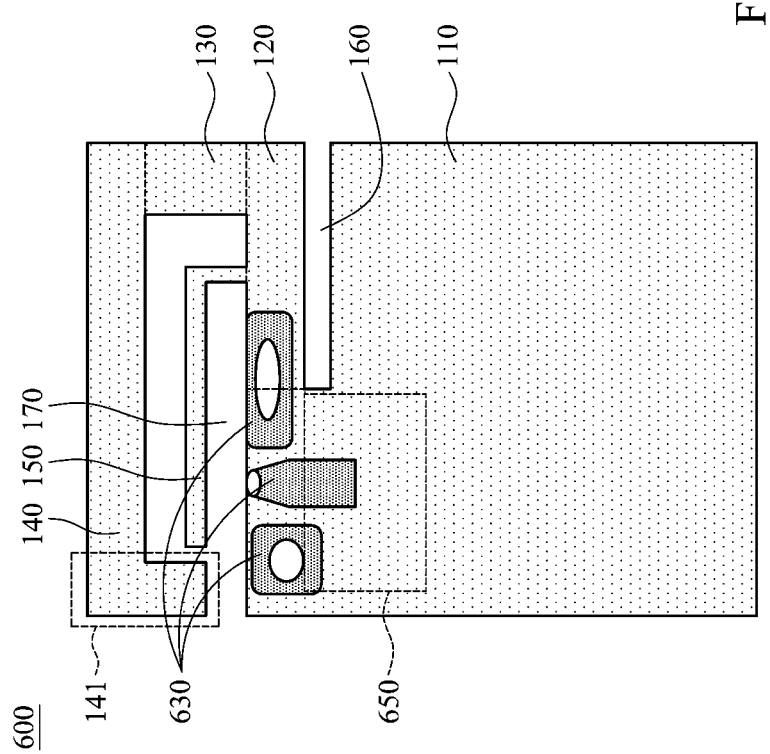
FIG. 6 shows a diagram of a mobile device according to an embodiment of the invention.
Figure 7:
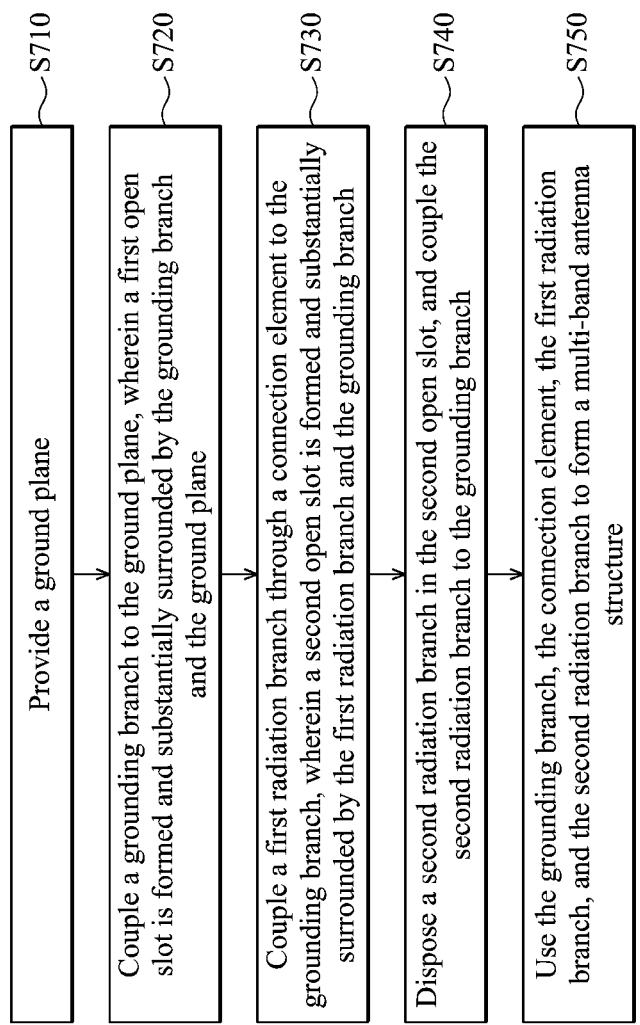
FIG. 7 shows a flowchart of a method for manufacturing a mobile device according to an embodiment of the invention.

FIG. 6 shows a diagram of a mobile device 600 according to an embodiment of the invention. FIG. 6 is basically similar to FIG. 1, and the diagram is also a plan developed view of an antenna structure of the mobile device 600. The difference between the two embodiments is that the mobile device 600 of FIG. 6 further includes one or more electronic components 630. The electronic components 630 may be disposed on the grounding branch 120 and/or the ground plane 110 of the mobile device 600. For example, the electronic components 630 may include a speaker, a camera, and/or an audio jack. The electronic components 630 are considered as a portion of a multi-band antenna structure of the mobile device 600, and therefore they do not tend to negatively affect the radiation performance of the multi-band antenna structure. Since the multi-band antenna structure loads the electronic components 630 and is integrated therewith appropriately, the aforementioned design can effectively save inner design space of the mobile device 600. The electronic components 630 may be further coupled through a wiring region 650 on the ground plane 110 to a processor module and a control module (not shown). Other features of the mobile device 600 of FIG. 6 are similar to those of the mobile device 100 of FIG. 1. Therefore, the two embodiments can achieve similar levels of performance FIG. 7 shows a flowchart of a method for manufacturing a mobile device according to an embodiment of the invention. The manufacturing method includes the following steps. In step S710, a ground plane is provided. In step S720, a grounding branch is coupled to the ground plane, and a first open slot is formed and is substantially surrounded by the grounding branch and the ground plane. In step S730, a first radiation branch is coupled through a connection element to the grounding branch, and a second open slot is formed and is substantially surrounded by the first radiation branch and the grounding branch. In step S740, a second radiation branch is disposed in the second open slot, and the second radiation branch is coupled to the grounding branch. In step S750, the grounding branch, the connection element, the first radiation branch, and the second radiation branch are integrated to form a multi-band antenna structure. Note that the above steps are not required to be performed in order, and any device feature of the embodiments of FIGS. 1-6 may be applied to the method of FIG. 7 for manufacturing the mobile device.

Note that the above element sizes, element shapes, and frequency ranges are not limitations of the invention. An antenna designer can fine-tune these settings or values according to different requirements. It is understood that the communication device and the antenna structure of the invention are not limited to the configurations of FIGS. 1-7. The invention may merely include any one or more features of any one or more embodiments of FIGS. 1-7. In other words, not all of the features displayed in the figures should be implemented in the communication device and the antenna structure of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for the ordinal term) to distinguish the claim elements.

The embodiments of the disclosure are considered as exemplary only, not limitations. It will be apparent to those skilled in the art that various modifications and variations can be made in the invention, the true scope of the disclosed embodiments being indicated by the following claims and their equivalents.

What is claimed is:

1. A mobile device, comprising:
    a housing, made of a conductive material, and comprising at least one slit; and
    an appearance metal element, comprising a first radiation branch and a second radiation branch, wherein the first radiation branch and the second radiation branch are portions of the appearance metal element;
    wherein a multi-band antenna structure is formed by the first radiation branch and the second radiation branch, and is located at one side of the housing with respect to the slit, and
    wherein the housing is integrated with the appearance metal element so as to form a single element.

2. The mobile device as claimed in claim 1, wherein the first radiation branch extends from the top of the mobile device to a portion of the back of the mobile device.

3. The mobile device as claimed in claim 1, wherein the first radiation branch extends from the top of the mobile device to a portion of the back of the mobile device, and each of the first radiation branch and the second radiation branch forms a respective portion of the housing.

4. The mobile device as claimed in claim 1, further comprising:
    a ground plane;
    a grounding branch, coupled to the ground plane, wherein a first open slot is formed and surrounded by the grounding branch and the ground plane; and
    a connection element.

5. The mobile device as claimed in claim 4, wherein the ground plane, the grounding branch, and the connection element are disposed inside the housing.

6. The mobile device as claimed in claim 4, wherein the connection element is a metal spring or a pogo pin.

7. The mobile device as claimed in claim 4, wherein the slit is long and narrow and aligned with the first open slot.

8. The mobile device as claimed in claim 4, wherein the first open slot has a straight-line shape.

9. The mobile device as claimed in claim 4, wherein the first radiation branch extends from the top of the mobile device to a portion of the back of the mobile device, the first radiation branch is coupled through the connection element to the grounding branch, and a second open slot is formed and surrounded by the first radiation branch and the grounding branch.

10. The mobile device as claimed in claim 9, wherein the second open slot has a straight-line shape.

11. The mobile device as claimed in claim 10, wherein the first radiation branch has a bending end extending toward an open end of the second open slot, such that the second open slot has a non-equal-width structure.

12. The mobile device as claimed in claim 9, wherein the second radiation branch is positioned within the second open slot and coupled to the grounding branch.

13. The mobile device as claimed in claim 12, wherein the second radiation branch has an inverted L-shape.

14. The mobile device as claimed in claim 12, wherein the shortest spacing between the second radiation branch and the first radiation branch is longer than 0.5 mm.

15. The mobile device as claimed in claim 4, further comprising:
    one or more electronic components, disposed on the grounding branch.

16. The mobile device as claimed in claim 15, wherein the electronic components comprise a speaker, a camera, and/or an audio jack.

17. The mobile device as claimed in claim 4, wherein the multi-band antenna structure has a first feeding point coupled to a first signal source, and a second feeding point coupled to a second signal source.

18. The mobile device as claimed in claim 17, wherein the first feeding point is coupled to the grounding branch, and the second feeding point is coupled to the second radiation branch.

19. The mobile device as claimed in claim 17, wherein when the multi-band antenna structure is excited by the first signal source, the multi-band antenna structure covers a mobile communication band, and wherein when the multi-band antenna structure is excited by the second signal source, the multi-band antenna structure covers a positioning system band.

20. The mobile device as claimed in claim 19, wherein the mobile communication band is from about 791 MHz to about 960 MHz and further from about 1710 MHz to about 2170 MHz, and wherein the positioning system band is from about 1560 MHz to about 1615 MHz.

21. The mobile device as claimed in claim 1, wherein the appearance metal element surrounds a non-metal area on the top of the mobile device, and the non-metal area accommodates at least one electronic component.

22. The mobile device as claimed in claim 7, wherein the slit extends from one side of the housing to another side of the housing.

* * * * *